(12) United States Patent
Lombaard

(10) Patent No.: US 7,006,021 B1
(45) Date of Patent: Feb. 28, 2006

(54) LOW POWER SERIALIZER CIRCUIT AND METHOD

(75) Inventor: Carel J Lombaard, Co. Cork (IE)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/874,719

(22) Filed: Jun. 23, 2004

Related U.S. Application Data

(60) Provisional application No. 60/482,933, filed on Jun. 27, 2003.

(51) Int. Cl.
*H03M 9/00* (2006.01)

(52) U.S. Cl. ..................... 341/100; 341/101
(58) Field of Classification Search ............... 341/100, 341/101
See application file for complete search history.

(56) References Cited

U.S. PATENT DOCUMENTS

| | | | | |
|---|---|---|---|---|
| 5,243,599 A | * | 9/1993 | Barrett et al. ............... | 370/541 |
| 5,721,545 A | * | 2/1998 | Poplevine .................... | 341/100 |
| 5,982,309 A | * | 11/1999 | Xi et al. ..................... | 341/101 |
| 6,696,995 B1 | | 2/2004 | Foley et al. ................. | 341/100 |

OTHER PUBLICATIONS

Lombaard, "Low-Power Pipelined 'Ripple Architecture' Serializer," Cypress International Technical Conference, Jul. 2002, pp. 1-2.

Green et al., "OC-192 Transmitter in Standard 0.18 μm CMOS," IEEE ISSCC 2002, Session 15, Gigabit Communications, ISSCC Visuals Supplement, pp. 198, 199, 469.

Cong et al., "A 10-Gb/s 16:1 Multiplexer and 10-GHz Clock Synthesizer in 0.25-μm SiGe BiCMOS," IEEE Journal of Solid-State Circuits, vol. 36, No. 12, Dec. 2001, pp. 1946-1953.

Andersson et al., "Silicon Bipolar Chipset for SONET/SDH 10 Gb/s Fiber-Optic Communication Links," IEEE Journal of Solid-State Circuits, vol. 30, No. 3, Mar. 1995, pp. 210-218.

* cited by examiner

*Primary Examiner*—Peguy JeanPierre
(74) *Attorney, Agent, or Firm*—Kevin L. Daffer; Daffer McDaniel, LLP

(57) ABSTRACT

A serializer within, for example, a transceiver is provided having multiple stages of pipelined multiplexing cells. Each multiplexing cell may be substantially the same and each comprises no more than one latch. In some embodiments, each multiplexing cell includes a multiplexer comprising a pair of inputs and a single latch, which is coupled to one input of the multiplexer. No latches are coupled to the other input of the multiplexer. The serializer generally includes a plurality of stages. Each successive stage includes one-half the number of multiplexing cells included in the previous stage, and each successive stage is clocked by a clocking signal that transitions at twice the frequency of the previous stage clock signal.

22 Claims, 4 Drawing Sheets

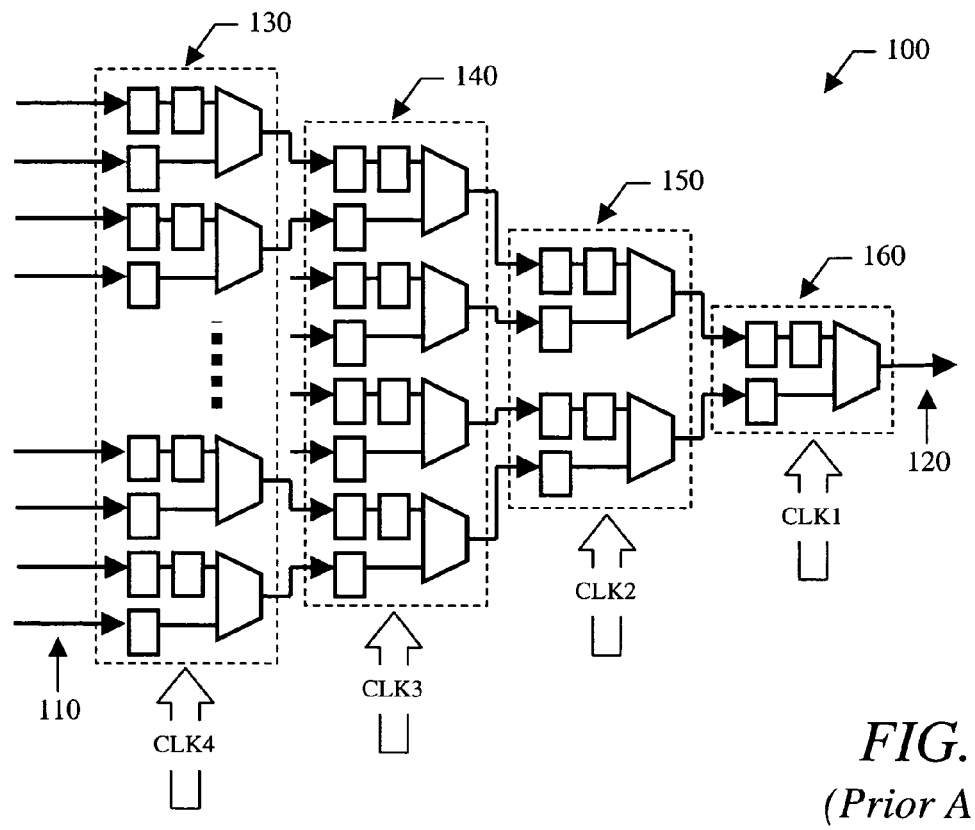
FIG. 1
*(Prior Art)*
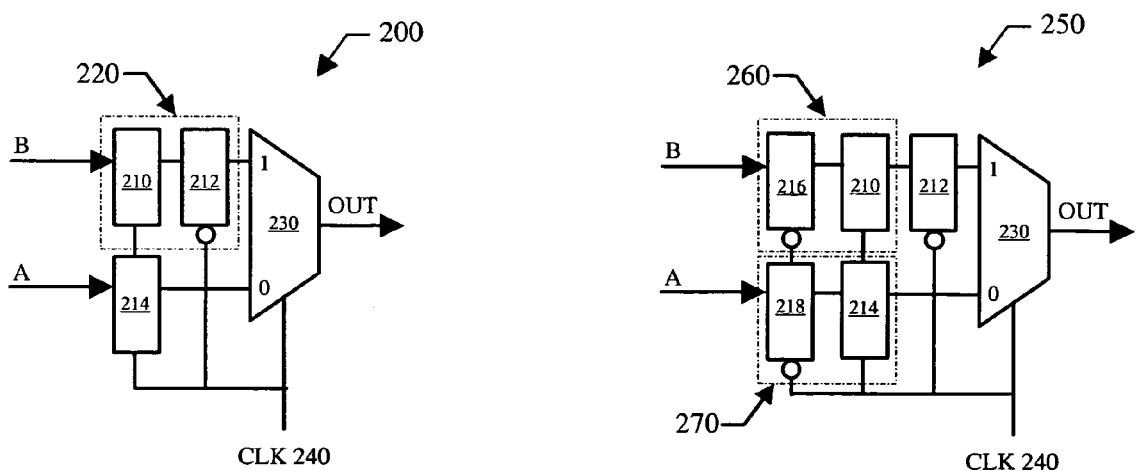
FIG. 2A
*(Prior Art)*
FIG. 2B
*(Prior Art)*

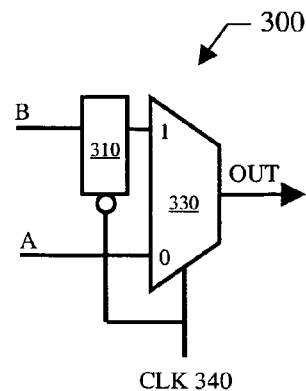
*FIG. 3*
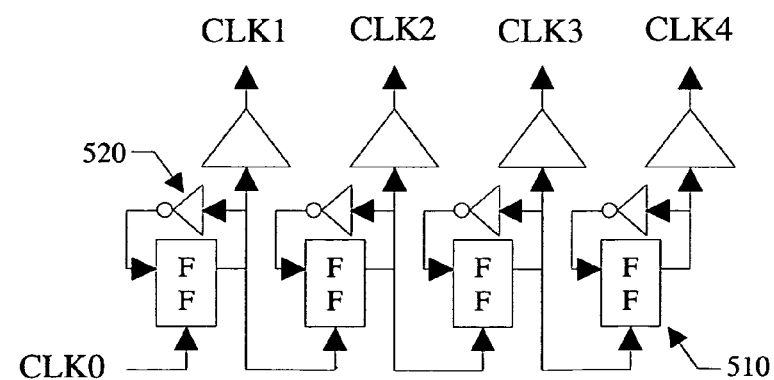
*FIG. 4*
*FIG. 5*

LOW POWER SERIALIZER CIRCUIT AND METHOD

PRIORITY CLAIM

This application claims benefit of priority to a provisional patent application Ser. No. 60/482,933 entitled "Low Power Serializer Circuit and Method," filed Jun. 27, 2003, which is hereby incorporated in its entirety.

BACKGROUND OF THE INVENTION

1. Field of the Invention

This invention relates to electronic circuitry and, more particularly, to a serializer that contains multiple multiplexing cells arranged in stages, where each cell contains fewer circuit elements and consumes less power than conventional multiplexing cells.

2. Description of the Related Art

The following descriptions and examples are given as background only.

Communication between nodes of a communication system typically involves a serial bitstream. The bitstream can be formatted in numerous ways and is sent across a wire or wireless medium between nodes of the network. Examples of serial bitstream transfer protocols include Ethernet and Synchronous Optical Network ("SONET"), as well as numerous others.

An integral part of the serialized communication between nodes is the transceiver associated with each node. A transceiver, having both a receiver and a transmitter, functions to convert the serial bitstream to a parallel datastream, if necessary. The conversion from a relatively high bit rate serial bitstream to a relatively low rate parallel datastream takes place within a receiver, and is often referred to as deserialization. Conversely, the conversion from a parallel datastream to a serial bitstream occurs within a transmitter, and is often referred to as serialization.

The serializer and deserializer of the transceiver are normally found within the physical media attachment ("PMA") sublayer of the transceiver. The serializer/deserializer is responsible for forwarding the datastreams between the upper layers of, for example, the Open System Interconnection ("OSI") model and the PMA sublayer. As the bit transfer rate of the serial bitstream increases, power consumption within the serializer/deserializer can also substantially increase. This is due, in part, to the time-division multiplexing and demultiplexing operations that take place at or near the bit transfer rate.

In its most basic form, a shift register can be used to construct a serializer/deserializer operating at slower bit rates. After the shift register in a serializer receives a parallel dataword, a clock signal shifts the parallel bits through each stage of the register to output the corresponding serial bitstream from a register element in the last stage. As the bit rate increases, however, clocking the data storage elements of the shift registers at full, or even half rates, may cause the serializer to consume undesirable amounts of power.

A particular form of serializer, which can operate at very high clock rates, is often referred to as a "pipelined serializer" (sometimes also called a "systolic serializer"). A pipelined serializer essentially arranges a plurality of multiplexing cells (or "cells") into stages. Subsequent stages are clocked at successively faster clock rates than previous stages. This allows for a majority of the multiplexing cells, especially in the front-end stages, to operate at much slower clock rates than the rate at which the serial bitstream is transmitted (i.e., the "serial data rate"). Since the "power-delay product" usually scales with frequency, circuits become increasingly less power efficient at higher frequencies. It then follows that power can be reduced in a pipelined serializer by reducing the number of multiplexing cells operating at the higher frequencies.

Pipelined serializers demonstrate substantial power savings over conventional shift registers, which are usually clocked at the serial data rate. However, pipelined serializers typically use multiple latches within each multiplexing cell. Regardless of clock rate, a multiplexing cell having more data storage elements (e.g., latches) consumes more power than a cell having fewer latches. In addition, multiplexing cells within conventional pipelined serializers typically include a relatively large number of latches and, therefore, are constrained to having a minimum power consumption level. Such a minimum power consumption level is often intolerable in many applications. In portable applications, for example, conventional multiplexing cells found within rather large n-to-1 serializers (where "n" is the input word length) may consume undesirable amounts of power as bit rates approach the technological limits. Finally, due to the excessive number of latches within each multiplexing cell, conventional pipelined serializers must often contend with extensive clock routing, undesirably long latency values and large area penalties.

Therefore, it would be desirable to introduce a multiplexing cell within a pipelined serializer that consumes less power than conventional multiplexing cells. It would also be desirable to decrease the overall number of data elements in the pipelined serializer, so as to reduce the fanout requirements of the clock signals supplied to the components of the serializer. A smaller and less power consumptive multiplexing cell can be used in large n-to-1 serializers, (where n might exceed 16, 32, or even 64) and/or within serializers operating at substantially high data rates.

SUMMARY OF THE INVENTION

The problems outlined above may be in large part addressed by an improved serializer, which arranges smaller and less power consumptive multiplexing cells in stages within a pipelined architecture. Broadly speaking, the present invention contemplates a serializer having a plurality of multiplexing cells arranged therein. In one example, the serializer may be formed as part of a transceiver, where the transceiver may be any device capable of converting a parallel datastream into serialized data or a serial bitstream. As used herein, the term "bitstream" may refer to a datastream comprised of serially arranged bits. Likewise, the term "parallel datastream" may be used to describe a datastream which is received by a data element in parallel, where the individual bits of a given binary "word" or logical unit may appear simultaneously across the "parallel datastream" at a given time instant. In this way, successive bits in the same relative position of the parallel datastream may also comprise a bitstream and one or more of these bitstreams may be referred to as "parallel bitstreams" or "bitstreams." Parallel bitstreams may, however, also refer to bitstreams that are not necessarily related to one another, but are presented "in parallel" to a data element. The exact meaning of the specific use of the word "bitstream" should be taken from the context. Furthermore, the design of the contemplated serializer could be essentially reversed to form a deserializer (e.g., multiplexing cells within the serializer may be replaced with demultiplexing cells in the deserializer, etc.)

According to one embodiment, a multiplexing cell may include a multiplexer comprising a pair of inputs (i.e., a 2-to-1 multiplexer) and a single latch, which is coupled to one input of the multiplexer. However, no latches may be coupled to the other input of the multiplexer. Thus, the multiplexing cell consists of the 2-to-1 multiplexer and no more than one latch. In some cases, the multiplexing cell may be included within a group of multiplexing cells arranged to form an n-to-1 serializer, where n is equal to a number of bits input to the serializer. In any case, the multiplexer and latch may be coupled for receiving a clock signal.

According to another embodiment, a pipelined serializer includes a first multiplexing cell, a second multiplexing cell and a third multiplexing cell. The first multiplexing cell is generally coupled to receive a pair of parallel bitstreams and to produce a first bitstream. The second multiplexing cell may be similarly coupled to receive another pair of parallel bitstreams and to produce a second bitstream. The third multiplexing cell is arranged within a subsequent stage of the serializer, and thus, may be coupled to interleave the first and second bitstreams to produce a third bitstream. Preferably, the first, second and third multiplexing cells are substantially the same and each comprise no more than one latch and one multiplexer. By arranging the first and second multiplexing cells within a first stage of the pipelined serializer, and arranging the third multiplexing cell within a second stage of the pipelined serializer subsequent to the first stage, at least one data path between the first and second stages comprises no latches.

In some cases, a clock generator may be coupled to the pipelined serializer for supplying a first clock signal to the first stage of the pipelined serializer, and supplying a second clock signal to the second stage of the pipelined serializer. If the first and second stages are adjacent to one another, a frequency of the first clock signal may be slower than a frequency of the second clock signal by a factor of 2. In some embodiments, the clock generator may include a synchronous clock generator, a nested Johnson counter or a Johnson counter with decoding. However, since each of these clock generators tend to consume a greater amount of power, a ripple counter clock generator may be chosen in preferred embodiments of the invention.

According to yet another embodiment, a method for serializing two or more parallel bitstreams is provided herein. The method may include, for example, generating first and second bitstreams from corresponding pairs of the parallel bitstreams. In particular, each of the first and second bitstreams may be generated using no more than one latch and one multiplexer, which are clocked by a first clock signal. In addition, a third bitstream may be generated by interleaving the first and second bitstreams using no more than one latch and one multiplexer, which are clocked by a second clock signal at twice the frequency of the first clock signal.

In some cases, the first and second bitstreams may be generated by first and second multiplexing cells, which, as noted above, preferably include no more than one multiplexer and one latch. Likewise, the third bitstream may be generated by a third multiplexing cell, which includes no more than one multiplexer and one latch. In some cases, the first, second and third multiplexing cells may be arranged in stages, where the first and second multiplexing cells comprise a previous stage, and the third multiplexing cell comprises a subsequent stage, of a pipelined serializer.

To serialize the parallel bitstreams, the step of generating a third bitstream may include receiving a rising edge of the second clock signal at the third multiplexing cell, on or before receiving a rising edge of the first clock signal at the first and second multiplexing cells. The rising edge of the first clock signal may enable a first bit value to be propagated to the input of the latch of the third multiplexing cell, while a second bit value is set up at a second input to the multiplexer of the third multiplexing cell. After the rising edge of the first clock signal is received, a falling edge of the second clock signal may be received at the third multiplexing cell. Successful pipeline operation can be ensured by guaranteeing that a rising clock edge in any given stage of the pipeline can only be followed by a falling clock edge in a subsequent (and therefore, faster) stage of the pipeline.

The falling edge of the second clock signal may enable the second bit value to be output from the third multiplexing cell, while the first bit value is forwarded to and set up at the first input of the multiplexer of the third multiplexing cell. After the falling edge of the second clock signal is received, a next rising edge of the second clock signal may be received at the third multiplexing cell on or before a falling edge of the first clock signal is received at the first and second multiplexing cells. The next rising edge of the second clock signal may enable the first bit value to be output from the third multiplexing cell, while third and fourth bit values from the first and second multiplexing cells of the previous stage are respectively set up at the latch and second multiplexer input of the third multiplexing cell. The process may then continue to interleave subsequent bit values to serialize the parallel bitstreams.

According to yet another embodiment, a method is provided herein for decreasing power consumption in a pipeline serializer, which arranges a number of multiplexing cells into one or more pipelined stages of the serializer. As noted above, each of the pipelined stages may be adapted to receive an increasingly faster clocking signal. In a general embodiment, the method may include forming each of the multiplexing cells by coupling only one latch to one input of a multiplexer and no latches to another input of the multiplexer. To ensure minimum jitter and power operation (for a given frequency) when only one latch is used per multiplexing cell, the method may also include matching a clock-to-output time delay through the multiplexers residing within a first stage of the serializer, with a clock-to-output time delay through the latches residing within a second stage of the serializer.

As used herein, the clock-to-output time delay through the multiplexers of the first stage may be substantially equal to: i) an amount of time needed to generate and input a first clocking signal to the first stage, after a second clocking signal is generated and input to the second stage, plus ii) an additional amount of time needed for the multiplexers of the first stage to output a value to the second stage, after the first clocking signal is received in the first stage. Likewise, the clock-to-output time delay through the latches of the second stage may be substantially equal to an amount of time needed for a latch of the second stage to forward a value at the input of the latch to the input of a multiplexer of the second stage, after a next transition of the second clocking signal is received in the second stage.

According to yet another embodiment, a method is provided herein for ensuring successful operation of a pipelined serializer, which arranges a number of multiplexing cells into one or more pipelined stages of the serializer. In a general embodiment, the method may include generating a plurality of successively faster clocking signals, and supplying each of the plurality of clocking signals to one of the pipelined stages, such that a rising edge of a given clocking signal can only be followed in time by a falling edge of a clocking signal supplied to a next pipeline stage. In some cases, the step of supplying may further ensure that a falling edge of a given clocking signal can only be followed in time by a falling edge of a clocking signal supplied to the next pipeline stage.

BRIEF DESCRIPTION OF THE DRAWINGS

Other objects and advantages of the invention will become apparent upon reading the following detailed description and upon reference to the accompanying drawings in which:

FIG. 1 is a block diagram illustrating a conventional n-to-1 pipelined serializer including a plurality of the multiplexing cells, such as those shown in FIG. 2A;

FIG. 2A is a block diagram illustrating one embodiment of a conventional multiplexing cell;

FIG. 2B is a block diagram illustrating another embodiment of a conventional multiplexing cell;

FIG. 3 is a block diagram illustrating one embodiment of a preferred multiplexing cell;

FIG. 4 is a block diagram illustrating one embodiment of a preferred n-to-1 pipelined serializer including a plurality of the multiplexing cells shown in FIG. 3;

FIG. 5 is a block diagram illustrating one embodiment of a clock generator;

Figure 6A:
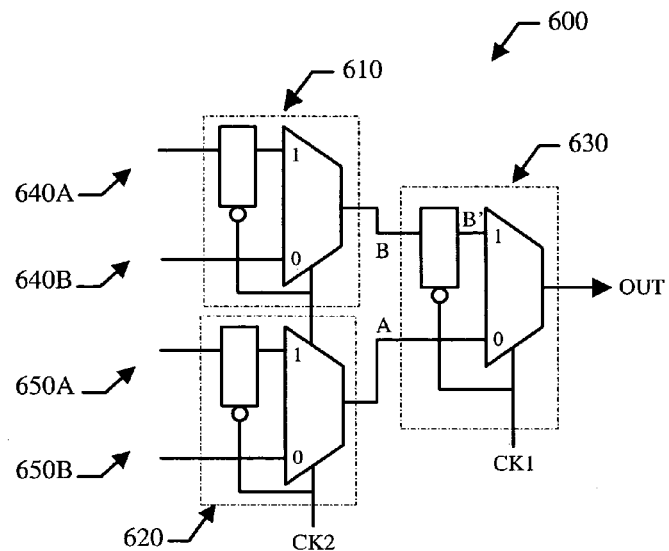
FIG. 6A is a block diagram illustrating one portion of the pipelined serializer of FIG. 4.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

A pipelined serializer is, in principle, a "pipelined multiplexer" constructed from a "binary tree" of "registered multiplexer" building blocks to form a serializer core with $\log_2(n)$ stages of pipelining, given an input word of length n. In general, pipelined serializers aim to reduce power consumption by reducing the number of circuit elements clocked at the "serial data rate," or the speed at which a serial bitstream is transferred between transmitting and receiving components of a system. The serial data rate may also be referred to as the "bit transfer rate." Pipelined serializers are typically constructed by arranging a plurality of multiplexing cells into stages, where each successive stage is clocked by a correspondingly faster clock rate. The opposite holds true for pipelined deserializers (i.e., each stage may be clocked by a successively slower clock rate). Since power efficiency tends to increase with decreasing speed, use of a pipelined serializer/deserializer generally reduces power consumption (as compared to, e.g., shift register serializers) by limiting the number of cells operating at faster clock rates at the expense of increasing the number of cells clocked at lower speeds.

Turning now to the drawings, FIG. 1 illustrates one embodiment of a pipelined serializer 100, which may form a part of a data transceiver circuit. Pipelined serializer 100 is essentially configured to convert multiple, parallel bitstreams 110 into serialized data or a serial bitstream 120. Pipelined serializer 100 may also be referred to as an n-to-1 serializer, where "n" is substantially equal to the input word length, or the number of parallel bitstreams that can be fed into a first stage 130 of pipelined serializer 100. In the embodiment of FIG. 1, serializer 100 may be configured for receiving sixteen parallel bitstreams, and thus, may be referred to as a 16-to-1 serializer. However, serializer 100 may be alternatively constructed to receive a greater or lesser number of parallel bitstreams (e.g., "n" may equal 8, 16, 32, 64, etc.).

To serialize the "n" number of parallel bitstreams, serializer 100 may include $\log_2(n)$ number of stages, where each successive stage is "clocked" (driven by a clock signal) at a substantially faster rate than the previous stage. Power consumption within serializer 100 is generally reduced (as compared to, e.g., shift register serializers) by limiting the number of cells clocked at faster rates, even if this increases the number of cells clocked at lower rates.

In the embodiment of FIG. 1, serializer 100 is shown having four stages 130, 140, 150 and 160. Each successive stage is shown having one-half the number of multiplexing cells included in the previous stage, and each successive stage is clocked by a clocking signal that transitions at twice the frequency of the previous stage clocking signal. There may be more or less than four stages, depending on the size of the serializer and the number of incoming parallel bitstreams 110. For example, five stages could be used to serialize a 32-bit word, six stages could be used to serialize a 64-bit word, and so forth.

Serializer 100 suffers from several disadvantages. As shown in FIG. 1, for example, the multiplexing cells of serializer 100 contain multiple data storage elements (e.g., latches), which typically consume a substantial amount of power. FIGS. 2A and 2B illustrate multiplexing cells commonly used in pipelined serializers.

As shown in FIG. 2A, multiplexing cell 200 includes three latches 210, 212, 214, of which 212 and 214 are coupled to the inputs of a 2-to-1 multiplexer 230. More specifically, latches 210 and 212 are serially coupled and are adapted to receive complementary clock signals. As such, latches 210 and 212 may form D-type flip-flop 220 which is coupled to one input of multiplexer 230. Latch 214, on the other hand, is coupled in parallel to latches 210 and 212 to the other input of multiplexer 230. As shown in FIG. 2A, latches 210 and 214 are coupled to receive a similar clock signal ("CLK") 240 for concurrently receiving a pair of parallel bitstreams (denoted "A" and "B"). Upon receiving a transition of specific polarity of clock signal 240, latch 214 is configured to output a bit of bitstream A to multiplexer 230, while latch 210 outputs a bit of bitstream B to latch 212. Subsequently, latch 212 may output a bit of bitstream B to multiplexer 230 upon receiving a next transition of the clock signal 240. In this manner, multiplexing cell 200 may serialize the pair of parallel bitstreams by delaying the output of bitstream B relative to bitstream A by an amount substantially equal to one-half of the clock signal cycle.

Generally speaking, multiplexing cell 200 is able to do so by incorporating an odd number of multiple latches (e.g., three) within the cell.

FIG. 2B illustrates another example of a multiplexing cell commonly found in pipelined serializers. In general, multiplexing cell 250 is similar to multiplexing cell 200 and, therefore, includes similar reference numerals to those shown in FIG. 2A. As such, multiplexing cell 250 includes latches 210, 212, 214 and multiplexer 230. Multiplexing cell 250 is also adapted to receive clock signal 240. As shown in FIG. 2B, however, multiplexing cell 250 includes additional storage devices, such as latches 216 and 218, thereby increasing the number of latches in the cell from three to five. In some cases, latches 216 and 210 may be coupled in series and adapted to receive complementary clock signals, thus forming D-type flip-flop 260. In other cases, a flip-flop of different design may be used. Latches 218 and 214 may be similarly coupled to form D-type flip-flop 270. In this manner, multiplexing cell 250 may be configured to serialize a pair of parallel bitstreams (denoted "A" and "B") by delaying the output of bitstream B relative to bitstream A by an amount substantially equal to one half of the clock signal cycle. As in the case of multiplexing cell 200, cell 250 is able to do so by incorporating an odd number of multiple latches (e.g., five) within the cell.

An odd number of latches is generally necessary to serialize the incoming parallel bitstreams by phase shifting (i.e., shifting in time) one of the parallel bitstreams relative to the other bitstream. The bitstreams may be further delayed by including an even greater odd number of latches within a given multiplexing cell. However, and as shown in FIGS. 2A and 2B, there is a common misconception that at least one latch must be coupled at the input of the multiplexing cell corresponding to the lesser-delayed bitstream (e.g., the input coupled to receive bitstream A in FIGS. 2A and 2B) to ensure successful pipeline operation.

Unfortunately, this misconception requires multiplexing cells to include a relatively large number of latches (e.g., at least three latches, as shown in FIG. 2A). A large number of latches generally results in high power consumption caused by, for example, undesirably high switching activity (e.g., in static CMOS), or a large number of elements drawing static current (e.g., in CML or DFL). Multiplexing cells 200 and 250 also suffer from a relatively large clock load, due to extensive clock routing and a large number of clock inputs; requiring powerful clock buffers, which further increases power consumption. Relatively large block area (which also contributes to longer clock routes) and high latency (i.e., the time needed to propagate through the elements of the cell) also stem from having a large number of latches within each of the multiplexing cells.

However, by recognizing that the dataflow can be arranged such that the bit values propagating from preceding stages in the pipeline don't change after they have propagated through subsequent stages and before they have been either 1.) propagated to the output, or 2.) been latched into latches in subsequent stages, some latches may be removed while still retaining the ability to serialize parallel datastreams. To overcome the previously mentioned problems, the present invention essentially involves replacing the relatively large number of latches in the multiplexer building block of previous implementations with one latch, and ensuring that the sequencing of the clock signals is correct, to ensure proper pipeline operation (including dataflow and timing). As mentioned before, pipelined serializers generally require more elements running at lower speeds and fewer elements running at higher speeds. However, by reducing the number of elements in the building block (which is a primary aspect of this invention), the amount of power and area consumed by the serializer can be drastically reduced.

FIG. 3 illustrates one embodiment of a multiplexing cell, which overcomes the disadvantages of previous multiplexing cells. Unlike cells 200 and 250 of FIGS. 2A and 2B, multiplexing cell 300 includes only one latch 310 coupled to an input of multiplexer 330, and no latches coupled to the other input of multiplexer 330. Obviously, cell 300 demonstrates a significant reduction in the total number of latches as compared to the number of latches within cells 200 and 250. As such, multiplexing cell 300 substantially avoids the problems (e.g., high power and area consumption, and in some cases, high latency) associated with cells 200 and 250. In other words, though the cells depicted in FIGS. 2 and 3 may operate at substantially identical speeds (i.e., operate at similar clock frequencies), multiplexing cell 300 consumes significantly less power and area than multiplexing cells 200 and 250. It is also worth noting that, with the correct timing applied, cell 300 has no inherent combinational logic delays (i.e. delays not initiated by a clock signal), which allows it to run at the maximum speed possible for a given technology.

Though only one latch is included, multiplexing cell 300 functions in a manner similar to the functioning of cells 200 and 250 described above. As shown in FIG. 3, for example, latch 310 may receive a bit of one bitstream of a pair of parallel bitstreams (denoted "A" and "B") after receiving a clock ("CLK") signal 340. In other words, a bit of bitstream B may be latched into latch 310 upon receiving a rising edge of the clock signal 340. On the next falling edge of the clock signal, a bit of bitstream A may be selected and propagated by multiplexer 330, while a new bit on bitstream B is propagated from latch 310 to multiplexer 330. A bit of bitstream B may then be propagated by multiplexer 330 on the next rising edge of clock signal 340. In this manner, multiplexing cell 300 may serialize the pair of parallel bitstreams by delaying the output of bitstream B relative to bitstream A by an amount substantially equal to one-half of the clock signal cycle. Unlike multiplexing cells 200 and 250, however, multiplexing cell 300 is able to do so by incorporating only one latch within the cell, thereby reducing the power, area and latency consumed by cell 300.

FIG. 4 illustrates one embodiment of an n-to-1 pipelined serializer 400, which includes a plurality of multiplexing cells 300 arranged into $\log_2(n)$ number of stages for serializing "n" number of parallel bitstreams. In the embodiment of FIG. 4, serializer 400 may be configured for receiving sixteen parallel bitstreams, and thus, may be referred to as a 16-to-1 serializer. It is understood, however, that serializer 400 may be alternatively constructed to receive a greater or lesser number of parallel bitstreams (e.g., "n" may equal 8, 16, 32, 64, etc.).

Similar to the serializer of FIG. 1, serializer 400 may form a part of a data transceiver circuit and, more specifically, the serializer part. It is envisioned, however, that serializer 400 can have far broader applications and can essentially be used in any circuit that converts multiple, parallel bitstreams 410 into serialized data or a serial bitstream 420. For example, serializer 400 may be incorporated within optical transceivers, backplane transceivers and computer peripheral interfaces, among others. Serializer 400 is shown in FIG. 4 as having four stages 430, 440, 450, and 460. Each successive stage is shown having one-half the number of multiplexing cells included in the previous stage, and each successive stage is clocked by a clocking signal that transitions at twice the frequency of the previous stage clock signal. Of course, there may be more or less than four stages, depending on the size of the serializer and the number of incoming parallel bitstreams 410. For example, five stages could be used to serialize a 32-bit word, six stages could be used to serialize a 64-bit word, and so forth.

Unlike serializer 100, however, serializer 400 includes multiplexing cells having no latches coupled to at least one input of the cell. As such, and as shown in FIG. 4, at least one data path through serializer 400 does not contain paths through latches, or register elements. Such a data path may be referred to herein as an "unregistered path."

FIG. 5 illustrates one embodiment of a clock generator that may be used to generate the clock signals input into each stage of the pipelined serializer 400. In a particular embodiment, clock generator 500 may include a series of flip-flops 510 coupled together to form a 4-bit binary ripple counter. By taking the inverted clock output from each flip-flop stage and feeding it back to it's own input (e.g., by coupling an inverting element 520 at the input of each flip-flop, in the case of single ended signals, or by swapping the output lines, in the case of differential signals), the full-rate clock, CLK0, with clock rate F, may be divided down to generate clock rates of F/2, F/4, F/8 and F/16 in the case of a 16-to-1 serializer. If the full rate clock is unavailable, the half-rate clock, F/2, should be available and may then be used directly for the first stage and divided down to generate the other clock rates. These clock rates, which correspond to clock signals CLK1, CLK2, CLK3 and CLK4, respectively, may differ in number (and/or frequency) depending on the number of stages (or bit width) of a particular serializer. As used herein, the "full-rate clock signal" (CLK0) may correspond to the serial data rate, or the speed at which a serial bitstream is transferred between transmitting and receiving components of a system.

In some embodiments, an alternative clock generator may be used to supply clocking signals to the various stages of the pipeline. For example, a synchronous clock generator (e.g., a synchronous counter) may be used to generate faster clock rates at the cost of increased power consumption. A nested Johnson counter or a Johnson counter with decoding may also be used to generate the clocking signals. A nested Johnson counter is known to be a set of Johnson counters, each of which receive a clock from its predecessor for operating at a successively lower frequency than its predecessor. A Johnson counter with decoding uses the state word in the Johnson ring and decodes a set of (slower) clocks from the state word. Either Johnson counter may be used when one wishes to avoid the delays incurred between clock signals. These counters, however, have higher power consumption, require initialization and are not inherently self-correcting. Thus, a ripple counter clock generator may be preferred, in some cases, due to the power savings attained by running the elements of the ripple counter at successively slower rates. The clock buffers (not labeled) of the ripple counter clock generator may also be deliberately skewed to compensate for the delays between successive clock signals (possibly at the cost of incurring somewhat higher power consumption). For the remainder of the discussion, therefore, ripple counter clock generator 500 will be used to generate the clocking signals supplied to serializer 400.

As mentioned before, conventional multiplexing cells (e.g., cells 200 and 250 of FIGS. 2A and 2B) usually contain at least three data storage devices, or latches, to ensure successful pipeline operation. In other words, conventional circuit designers thought it necessary to temporarily store both bits of a pair of bitstreams in data storage devices of the multiplexing cell before those bitstreams were alternately propagated through the cell. However, the present inventor has recognized an alternate means for maintaining successful pipeline operation, while allowing fewer latches to be used within a given multiplexing cell.

The primary function of a multiplexing cell is to pass the data at its inputs to its output on alternate transitions of the clock signal. In this manner, each multiplexing cell may serialize two bits at a time, each in one-half of a clock signal cycle. Thus, each multiplexing cell may be considered a small serializer. When the building blocks are combined in a tree, this operation is extended in a binary fashion throughout the tree. To ensure pipelined operation, a general principle can be applied within a building block, as well as when the blocks are arranged in a tree: data bits are allowed to propagate through any data element only when the subsequent data path has been closed or is being closed by a transition of a clock signal.

The above-mentioned principle may be applied as follows:

1. For an individual multiplexing cell (e.g., cell 300 of FIG. 3), the latch and multiplexer components are clocked with clock signals such that the latch will be open to propagate new data only when the opposite input of the multiplexer (i.e., the input not connected to the latch output) is selected. The timing diagram of FIG. 6B illustrates exemplary timing characteristics of one pipeline stage.

Figure 7:
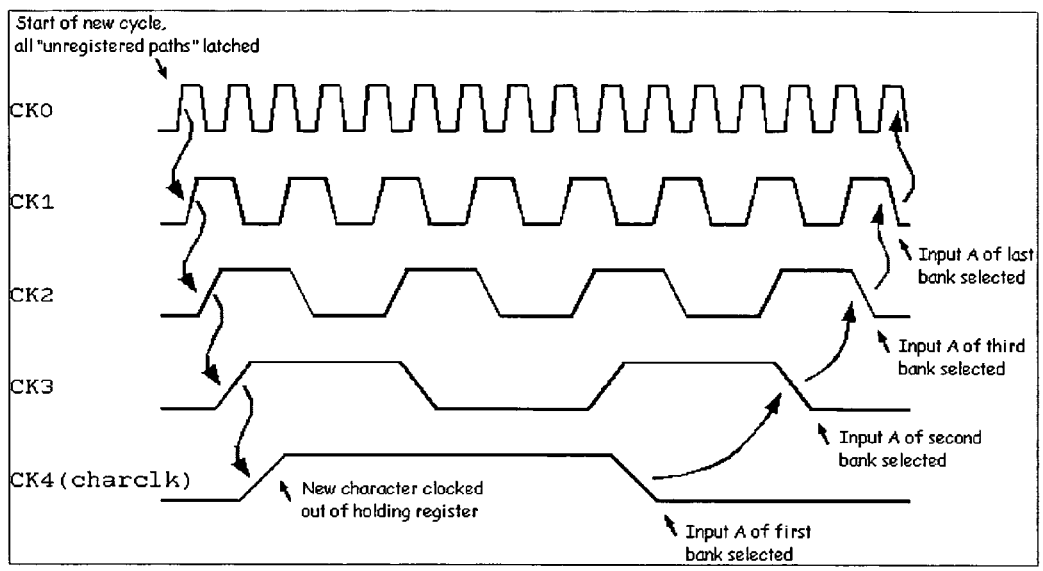
FIG. 7 is a timing diagram illustrating exemplary clock signals, which may be generated by the clock generator of FIG. 5 and used to clock the multiplexing cells within corresponding stages of the pipelined serializer shown in FIG. 4.

2. For a multiplexer tree (e.g., serializer 400 of FIG. 4), the sequencing of clock signals output from the clock generator may be arranged such that, for every stage of the pipeline, the clock edge that propagates from a given stage of the clock generator (through a next stage of the clock generator) is also the edge that closes the data paths in the corresponding serializer pipeline stage to data from a previous pipeline stage. FIG. 7 is a timing diagram illustrating exemplary clock sequencing that may be used to ensure successful pipeline operation.

By applying the above principles, pipeline behavior can be maintained even though only one latch is included within a given multiplexing cell. This may be possible since the multiplexers act as retiming elements, even though they're not data storage devices.

Figure 6B:
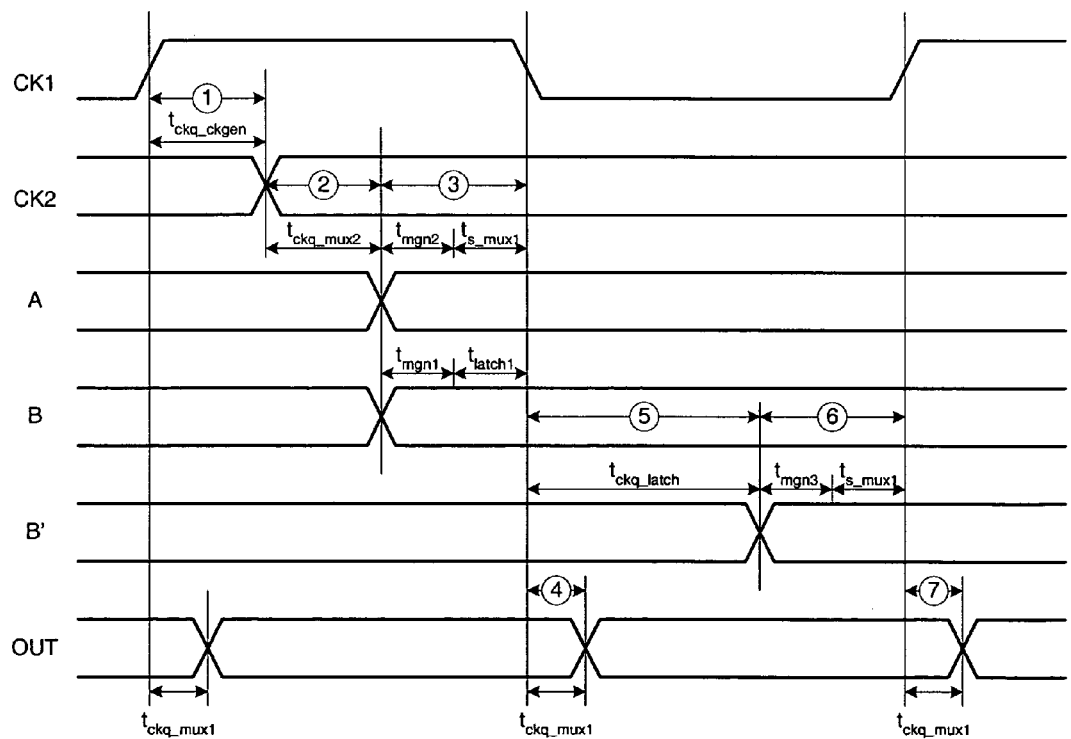
FIG. 6B is a timing diagram illustrating exemplary timing characteristics of the portion of the pipelined serializer shown in FIG. 6A.

FIG. 6B is a timing diagram illustrating exemplary timing characteristics of a portion 600 of the pipelined serializer 400, where portion 600 is shown in FIG. 6A. More specifically, FIGS. 6A and 6B may be used to describe the timing characteristics responsible for ensuring successful pipeline operation, if as described above, the latch and multiplexer elements of the cell are clocked using properly sequenced clocking signals.

As shown in FIG. 6A, portion 600 includes three multiplexing cells 610, 620 and 630, where each cell is substantially identical in structure and function to cell 300 of FIG. 3. Multiplexing cells 610 and 620 each receive a pair of parallel bitstreams (denoted 640A, 640B and 650A, 650B, respectively), in addition to a clocking signal ("CK2"). In the manner described above, each of multiplexing cells 610 and 620 may generate a serial bitstream by interleaving the pair of parallel bitstreams received at their inputs. These serial bitstreams (denoted "A" and "B") may be subsequently output to multiplexing cell 630 in the next stage of the pipeline. Multiplexing cell 630 is, therefore, configured to receive the two serial bitstreams (at its parallel inputs), and after receiving another clocking signal ("CK1"), to generate a second serial bitstream (denoted "OUT") by interleaving bitstreams A and B.

FIG. 6B illustrates the timing characteristics within the data paths of portion 600. In general, the timing characteristics of FIG. 6B may guarantee pipeline operation by ensuring that, when the output of any given data element changes (e.g., as a result of a clock signal or a change at its inputs), the value at that output has crossed a logic threshold by enough of a margin for the next data element in the path to resolve the bit value before the next data element "opens" to propagate the bit.

The above-mentioned timing diagrams will now be described in more detail in reference to FIGS. 6A and 6B. As noted above, each subsequent stage of a pipelined serializer may be clocked with a substantially faster clocking signal. As shown in FIGS. 6A and 6B, the "faster" clocking signal (i.e., CK1) may be supplied to the multiplexing cell (630) in the second stage before the "slower" clocking signal (i.e., CK2) is supplied to the multiplexing cells (610 and 620) in the first stage. The delay ① between the two clocking signals corresponds to the clock-to-output delay ($t_{ckq\_ckgen}$) through the relevant clock generator stage. However, this delay is generally attributed to the use of a ripple counter clock generator, and therefore, may not be incurred in all embodiments of the invention.

When a rising or falling edge of CK2 is received in the first stage, bits of bitstreams A and B may be output from multiplexers 610 and 620 after a short delay ② substantially equal to the clock-to-output delay ($t_{ckq\_mux2}$) through those multiplexers. The delay ③ ($t_{mgn2}+t_{s\_mux1}$), denotes a time period during which preferably no changes should occur in the bit value of bitstream A that was setup at the input of the second stage multiplexer during delay ②. Likewise, for the bit value of bitstream B that was propagated to the second stage latch during delay ②, the delay ③ ($t_{mgn1}+t_{latch1}$) denotes a time period during which preferably no changes should occur in the bit value of bitstream B. (Strictly speaking, the respective bit values should preferably not change during the $t_{s\_mux1}$ and $t_{latch1}$ time periods, but a marginal time delay ($t_{mgn2}$ or $t_{mgn1}$) may be added to those time periods to ensure that this requirement is observed.)

More precisely, $t_{s\_mux1}$ and $t_{latch1}$ may each be described as periods of time before which the respective bit values needs to have crossed the logic threshold, so that when each bit value is propagated by the latch/mux, the propagation delay through the latch/mux is deterministic (i.e., the time instant when the latch/mux output value crosses the logic threshold is determined mostly by the time instant of the clock transition and not by the time instant of the data transition). It is also noted that the term "setup time" may be used herein, to refer to any such length of time during which an input value needs to have been established at an unselected data element input before it is selected for propagation through the data element.

Once a falling edge of CK1 is received in the second stage, a bit value of bitstream A may be output from the second stage after a delay ④, which is approximately equal to the clock-to-output delay ($t_{ckq\_mux1}$) through the second stage multiplexer. The falling edge of CK1 also enables a bit value of bitstream B to be propagated to the second stage multiplexer (denoted B') after a short delay ⑤ through the latch ($t_{ckq\_latch}$). A delay ⑥ ($t_{mgn3}+t_{s\_mux1}$), denotes a time period during which preferably no changes should occur in the bit value of bitstream B' that was setup at the second stage multiplexer during delay ⑤, before it is output from the multiplexer on the next rising edge of CK1. As with bitstream A, the bit value of bitstream B' is output after a short delay ⑦ equal to the clock-to-output delay ($t_{ckq\_mux1}$) through the second stage multiplexer.

Typically, optimum pipeline timing can be ensured by adjusting (if necessary) a specific set of parameters. The set of parameters may include, for example, the clock-to-output delay ($t_{ckq\_ckgen}$) through the relevant clock generator stage, the clock-to-output delay ($t_{ckq\_mux2}$) through the multiplexers driven by CK2, and the "setup time" ($t_{s\_mux1}$) of the multiplexer driven by CK1. In some cases, pipeline operation may be optimized for maximum speed by minimizing the delays incurred through 1.) the clock generator stage (i.e., the delay through ①), 2.) the first stage multiplexers (i.e., the delay through ②) and 3.) the "setup time" of the second stage multiplexers (i.e., $t_{s\_mux1}$) (It is also possible to eliminate, as mentioned before, for the most part, the delay through the clock generator stage by deliberately skewing the delays through the clock buffers by, for example, adding proportionately more clock buffer stages in the higher-rate clock signals.) In any event, it may also be beneficial to set $t_{s\_mux1}$ substantially equal to $t_{latch1}$ when maximizing speed.

The reason, firstly, why optimum pipeline timing may be determined by the above parameters, and not by, for example, the clock-to-output delay through the latch ($t_{ckq\_latch}$), is that the delay through the latch typically has more margin and can be set independently to provide or absorb margin as necessary. In some cases, it may be beneficial to relax the delay of the latch to absorb margin, thereby saving power. For example, pipeline operation may be optimized for minimum power consumption (at a given speed) by setting the delays incurred through the clock generator and the first stage multiplexers (i.e., the delays through ① and ②) equal to the delay through the second stage latch (e.g., the delay through ⑤). However, doing so only functions to optimize serializer performance, and therefore, is not necessary in all aspects of the invention.

Secondly, individual data paths within the multiplexing cell may experience different failure mechanisms. If the above ("setup time") requirements are violated for the upper (B) data path, for example, the latch output (denoted B') may be delayed and become less predictable, causing the margin for the latch output, $t_{mgn3}$, to be reduced. Such a case may lead to a jittery and possibly, delayed multiplexer output (denoted "OUT") and may eventually lead to the same requirement being violated for the latch input path (B) in a subsequent stage. On the other hand, if the above principles are violated for lower (A) data path, the multiplexer output may be delayed. This may lead to a more sudden failure, since the effect will tend to propagate through the lower paths of subsequent stages if timing in those stages is equally marginal (presumably because the serializer is being driven at too high a clock frequency), causing corruption of data.

In some cases, the above requirements may be violated within either data path when the serializer is being driven past the recommended maximum frequency of operation. However, the present inventor has recognized that, with some care, the latch and [multiplexer+clock generator] clock-to-output delays can be matched to ensure equal margin, thereby ensuring equal failure rates for both paths as the clock frequency is increased past the recommended maximum operating frequency. In other words, by matching $t_{ckq\_latch}$ (i.e., the clock-to-output delay through a given latch) to the sum of $t_{ckq\_ckgen}$ and $t_{ckq\_mux2}$ (and assuming that that $t_{s\_mux1}$ and $t_{latch1}$ are equal), the margin in the upper (B) and lower (A) data paths may be reduced by an equal amount as the clock frequency is increased.

When the delays through the data paths are matched, the margin in the data paths will be equally reduced as the clock frequency is increased. Hence, the failure rates will be the same for both paths, and thus, neither path will be more "critical" than the other. (Note: one path may be considered more "critical" than another if it is more likely to be responsible for failures as the frequency is increased.) This may be considered an optimum point at which maximum power savings can be obtained for a given operating frequency.

If the delays are not matched, however, the margin may not be equal for both paths; hence, one path may be more critical than the other and would be responsible for failures if the frequency were increased. In this situation, a maximum power savings for a given operating frequency can be attained by reducing the power to the elements in the less critical path, thereby increasing the delay and giving up margin until both paths become substantially "equally critical." (This may also minimize undesirable systematic jitter due to path mismatches. In some cases, this may not be necessary if the full-rate serial output bitstream will be re-timed through latches or registers clocked by the full-rate clock, but is worth noting.) In this manner, serializer 400 may consume significantly less power and area and may exhibit significantly less latency (due to, e.g., the substantial reduction in the number of latches within each multiplexing cell) than the serializer of FIG. 1, even when the serializers are run at the same speed.

As noted above and shown in FIG. 7, it may also be beneficial to properly sequence the clock signals input to each stage of serializer 400 to ensure successful pipeline operation. The clock signals are numbered in FIG. 7 from the fastest clock (i.e., the full-rate clock CK0) to the slowest clock (i.e., the character or word clock CK4). At the start of a pipeline cycle, a rising clock edge propagates from the full-rate clock through all clock generator stages (denoted by the arrow on the left-hand side of FIG. 7). This edge ensures that data bits, which during a previous cycle propagated through unregistered paths in the tree (i.e., data paths without any latches), are latched into latches (the bit that rippled through the bottom-most unregistered path has already been output at the serializer output). New data may also appear at the inputs to the first pipeline stage on this first rising edge. Note how, because of the clock sequencing, any rising clock edge in any given stage may be followed only by a falling clock edge in a subsequent (i.e., faster) stage. (It follows logically that any falling edge may, similarly, also only be followed by a falling edge in a subsequent stage.) This may provide the controlled, clocked "ripple effect" in the unregistered paths that is responsible, at least in part, for maintaining the pipelined behavior.

Referring to FIG. 4, a holding register (not shown) at the parallel input (410) of the pipeline serializer (400) may retain new data for one character (or data word) clock period (i.e., the clock period of CK4). To ensure proper pipeline operation, the bit values established in the "unregistered" paths (paths without latches) for a given data word cycle may only change once each bit value has either: 1) propagated to the output of the serializer (for the bottom-most data path in FIG. 4), or 2) been stored within a subsequent stage latch (note: every unregistered path, other than the bottom-most path, terminates into a latch in a subsequent stage). In other words, the data bits within any unregistered path are guaranteed to be latched into a subsequent stage latch (or propagated to the output of the serializer in the case of the bottom-most path) before the data from the holding register may change. The same principle may apply, in sub-data word cycles, for all other internal data paths without register elements.

A serializer architecture and method have been described herein, which uses a reduced number of register elements, and more specifically, allows a single latch to be used within the multiplexing cells of the serializer while retaining the pipeline behavior. By reducing the number of latches within a given cell from three (or possibly five or even more) latches to only one latch, the total number of latches within an n-to-1 serializer may be reduced from 3(n-1) or 5(n-1) latches to (n-1) latches. Consequently, the overall size of the serializer, as well as the amount of power consumed by the serializer, may be reduced by a factor of approximately 2 to 3, or more (though some "overhead" in power and size, such as for the clock generator, may be involved). Reducing the number of latches may also function to reduce the latency of the serializer. Referring to FIG. 7, for example, the latency of one cycle of the pipelined serializer may be determined by the number of full-rate clock cycles needed to propagate the first bit in the bitstream to the output through the bottom-most path in the tree (i.e., the path with no register elements). In this manner, a 16-bit serializer formed according to the present invention may demonstrate a latency of 15 full-rate clock cycles. As used herein, the term "latency" may refer to the time it takes for the first data bit of a given data word to propagate through the serializer from the time that it "enters" the serializer (i.e., appears at the serializer inputs). It is understood, however, that the latency may increase or decrease depending on the number of stages included within the serializer.

The purpose of the present invention is to serialize parallel data, that is, to construct a single serial bitstream from a sequence of parallel data words, such that the serial bitstream is equivalent to the sequence of parallel data words, but represented serially, with the individual bits of each data word appearing sequentially in the bitstream rather than simultaneously in multiple bitstreams. The invention specifically aims to do this with the lowest power possible for a given technology when running the serializer at speeds approaching the technological limits.

In light of this disclosure, one could easily recognize that the present invention provides several advantages over older technology. Some of those advantages may include, for example, reduced area, clock load, and power, due to the reduced number of register elements included within the serializer. In addition, no reset may be required when using a ripple counter as a clock generator (as shown in FIG. 5). This may provide a simpler circuit design with less routing (e.g., no reset signal needs to be routed through the block), while avoiding the speed and power penalties that may be incurred by other clock generators. Though such an invention may be applicable to a variety of devices, the invention may be especially suited for integrated circuits with high data rates and where power consumption is critical. For example, the invention may be particularly suited for personal computing peripheral devices (such as high-speed USB2.0 devices, Firewire devices, etc.), satellite communications circuits, optical transceivers and backplane transceivers (in, e.g., high density data routers), among others.

It will be appreciated to those skilled in the art having the benefit of this disclosure that this invention is believed to provide a pipelined serializer architecture, which functions to reduce power and area consumption, and in some cases, to reduce the latency through the serializer. Further modifications and alternative embodiments of various aspects of the invention will be apparent to those skilled in the art in view of this description. For example, though the architecture and method are described in reference to a serializer, such as serializer 400 of FIG. 4, the architecture and method may also be applied to a deserializer with the appropriate mathematical and logical transformations. The improvements described herein may, therefore, be applied to an n-to-1 serializer (or a 1-to-n deserializer), where n corresponds to any reasonable number of parallel bitstreams. In some embodiments, one or more of the multiplexing cells within the serializer/deserializer may include more than one latch (e.g., three or five latches). In such an embodiment, however, all multiplexing cells within a given stage should be substantially identical. For example, one may wish to include more than one latch in the last stage of the serializer to reduce systematic jitter. This may somewhat increase the size and power consumption of the serializer, in addition to requiring some of the clock stages to be inverted. It is intended, therefore, that the following claims be interpreted to embrace all such modifications and changes and, accordingly, the specification and drawings are to be regarded in an illustrative rather than a restrictive sense.

What is claimed is:

1. A pipelined serializer, comprising:
   a first multiplexing cell coupled to receive a pair of parallel bitstreams and to produce a first serial bitstream;
   a second multiplexing cell coupled to receive another pair of parallel bitstreams and to produce a second serial bitstream;
   a third multiplexing cell coupled to interleave the first and second serial bitstreams to produce a third serial bitstream; and
   wherein the first, second and third multiplexing cells are substantially the same and each comprise no more than one latch.

2. The pipelined serializer as recited in claim 1, wherein the third multiplexing cell, or the first and second multiplexing cells, comprise an odd number of latches greater than one.

3. The pipelined serializer as recited in claim 1, wherein the first and second multiplexing cells are arranged within a first stage of the pipelined serializer, wherein the third multiplexing cell is arranged within a second stage of the pipelined serializer subsequent to the first stage, and wherein at least one data path between the first and second stages comprises no latches.

4. The pipelined serializer as recited in claim 3, wherein the first stage of the pipelined serializer is configured for receiving a first clock signal, and the second stage of the pipelined serializer is configured for receiving a second clock signal, and wherein a frequency of the first clock signal is slower than a frequency of the second clock signal by a factor of 2.

5. The pipelined serializer as recited in claim 4, further comprising a clock generator coupled to the first and second stages of the pipelined serializer for supplying the first and second clock signals.

6. The pipelined serializer as recited in claim 5, wherein the clock generator comprises a ripple counter clock generator.

7. The pipelined serializer as recited in claim 5, wherein the clock generator comprises a synchronous clock generator, a nested Johnson counter or a Johnson counter with decoding.

8. A method for serializing parallel bitstreams, wherein the method comprises:
   generating first and second bitstreams from corresponding pairs of the parallel bitstreams, wherein each of the first and second bitstreams are generated using no more than one latch, which is clocked by a first clock signal;
   generating a third bitstream by interleaving the first and second bitstreams using no more than one latch, which is clocked by a second clock signal at twice the frequency of the first clock signal.

9. The method as recited in claim 8, wherein the first and second bitstreams are generated by first and second multiplexing cells, each of which includes no more than one multiplexer and one latch.

10. The method as recited in claim 8, wherein the third bitstream is generated by a third multiplexing cell, which includes no more than one multiplexer and one latch.

11. The method as recited in claim 10, wherein the step of generating a third bitstream comprises receiving a rising edge of the second clock signal at the third multiplexing cell before a rising edge of the first clock signal is received at the first and second multiplexing cells.

12. The method as recited in claim 11, wherein the rising edge of the first clock signal enables a first value to be received at the latch of the third multiplexing cell, while a second value is set tip at a second input of the multiplexer of the third multiplexing cell.

13. The method as recited in claim 12, wherein the step of generating a third bitstream further comprises receiving a falling edge of the second clock signal at the third multiplexing cell after the rising edge of the first clock signal is received at the first and second multiplexing cells.

14. The method as recited in claim 13, wherein the falling edge of the second clock signal enables the second value to be output from the third multiplexing cell, while the first value is forwarded to and set up at a first input of the multiplexer of the third multiplexing cell.

15. The method as recited in claim 14, wherein the step of generating a third bitstream further comprises receiving a next rising edge of the second clock signal at the third multiplexing cell on or before a falling edge of the first clock signal is received at the first and second multiplexing cells.

16. The method as recited in claim 15, wherein the next rising edge of the second clock signal enables the first value to be output from the third multiplexing cell, while third mid fourth values are respectively received at the latch and the second input of the multiplexer of the third multiplexing cell.

17. The method as recited in claim 8, wherein the third bitstream is generated by a third multiplexing cell, which includes one multiplexer and more than one latch.

18. A method for decreasing power consumption in a pipeline serializer that arranges a number of multiplexing cells into one or more pipelined stages of the serializer, each being adapted to receive an increasingly faster clocking signal, wherein the method comprises;
   forming each of the multiplexing cells by coupling only one latch to one input of a multiplexer and no latch to another input of the multiplexer; and
   decreasing power consumption by matching a clock-to-output time delay through the multiplexers residing within a first stage of the serializer with a clock-to-output time delay through the latches residing within a second stage of the serializer.

19. The method as recited in claim 18, wherein the clock-to-output time delay through the multiplexers of the first stage is substantially equal to: i) an amount of time needed to generate and input a first clocking signal to the first stage, after a second clocking signal is generated and input to the second stage, plus ii) an additional amount of time needed for the multiplexers of the first stage to output a value to the second stage, after the first clocking signal is received in the first stage.

20. The method as recited in claim 19, wherein the clock-to-output time delay through the latches of the second stage is substantially equal to an amount of time needed for the latches of the second stage to forward a latched value to the multiplexers of the second stage, after a next transition of the second clocking signal is received in the second stage.

21. A method for ensuring successful operation of a pipelined serializer that arranges a number of multiplexing cells into one or more pipelined stages of the serializer, the method comprising:

generating a plurality of successively faster clocking signals; and supplying each of the plurality of clocking signals to a different one of the pipelined stages, such that a rising edge of a given clocking signal supplied to a given pipeline stage can only be followed in time by a falling edge of a faster clocking signal supplied to a next pipeline stage.

22. The method as recited in claim 21, wherein the step of supplying further ensures that a falling edge of a clocking signal supplied to a given pipeline stage can only be followed in time by a falling edge of a faster clocking signal supplied to a next pipeline stage.

* * * * *

UNITED STATES PATENT AND TRADEMARK OFFICE
CERTIFICATE OF CORRECTION

| | | |
|---|---|---|
| PATENT NO. | : 7,006,021 B1 | Page 1 of 1 |
| APPLICATION NO. | : 10/874719 | |
| DATED | : February 28, 2006 | |
| INVENTOR(S) | : Lombaard | |

It is certified that error appears in the above-identified patent and that said Letters Patent is hereby corrected as shown below:

<u>In the Claims</u>

<u>Col. 16</u>
at line 16: please delete "tip" and substitute therefor --up--.
at line 35: please delete "mid" and substitute therefor --and--.
at line 46: please delete ";" after "comprises" and substitute therefor --:--.

Col. 17, line 11: please delete "given" before "clocking signal."

Signed and Sealed this

Twenty-sixth Day of December, 2006

JON W. DUDAS
*Director of the United States Patent and Trademark Office*